(12) United States Patent
Fujita et al.

(10) Patent No.: US 7,924,090 B2
(45) Date of Patent: Apr. 12, 2011

(54) AMPLIFYING DEVICE

(75) Inventors: Noriyuki Fujita, Saitama (JP); Shigeo Masai, Kanagawa (JP); Masaharu Sato, Shiga (JP)

(73) Assignee: Panasonic Corporation, Osaka (JP)

( * ) Notice: Subject to any disclaimer, the term of this patent is extended or adjusted under 35 U.S.C. 154(b) by 103 days.

(21) Appl. No.: 12/445,836

(22) PCT Filed: Oct. 29, 2007

(86) PCT No.: PCT/JP2007/071065
§ 371 (c)(1),
(2), (4) Date: Apr. 16, 2009

(87) PCT Pub. No.: WO2008/053857
PCT Pub. Date: May 8, 2008

(65) Prior Publication Data
US 2010/0295614 A1 Nov. 25, 2010

(30) Foreign Application Priority Data
Oct. 31, 2006 (JP) ................. P2006-295117

(51) Int. Cl.
*H03F 3/30* (2006.01)
(52) U.S. Cl. ............ 330/207 P; 330/296; 330/298
(58) Field of Classification Search ........ 330/207 P, 330/296, 298
See application file for complete search history.

(56) References Cited

U.S. PATENT DOCUMENTS

| 6,894,567 | B2 * | 5/2005 | Vickram et al. | 330/298 |
|---|---|---|---|---|
| 6,900,698 | B2 * | 5/2005 | Ikeda | 330/298 |
| 7,119,622 | B2 | 10/2006 | Sato | |
| 7,342,435 | B2 * | 3/2008 | Becker et al. | 327/534 |
| 7,355,476 | B2 * | 4/2008 | Kasha et al. | 330/284 |
| 7,449,956 | B2 * | 11/2008 | Ryynanen et al. | 330/292 |
| 7,595,696 | B2 * | 9/2009 | Sugiura et al. | 330/298 |
| 2005/0134384 | A1 | 6/2005 | Sato | |

FOREIGN PATENT DOCUMENTS

| EP | 1 802 164 A1 | 6/2007 |
|---|---|---|
| JP | 52-132685 | 11/1977 |
| JP | 61-126806 | 6/1986 |
| JP | 08-182092 | 7/1996 |
| JP | 2005-204297 | 7/2005 |
| WO | WO 2006/033269 A1 | 3/2006 |

* cited by examiner

*Primary Examiner* — Patricia Nguyen
(74) *Attorney, Agent, or Firm* — McDermott Will & Emery LLP

(57) ABSTRACT

An amplifying device for setting input impedance at several GΩ to several tens of GΩ and improving an ESD withstand current rating is provided.

An ECM is connected to an input terminal 21 and frequency characteristics become flat to a voice band by high input impedance of a CMOS amplifier 20 and the input impedance is set at several GΩ to several tens of GΩ and thereby, response time after detecting a loud voice or turning on a power source of the ECM is speeded up and desired electrical characteristics are achieved. A path for releasing a surge voltage which occurs during assembly in the outside of an IC and intrudes from the input terminal 21 to a power source terminal or an earth terminal without an influence on a signal (20 Hz to 20 kHz) of a voice band entering from the input terminal 21 can be constructed by connecting a P-channel MOS transistor 27 and an N-channel MOS transistor 28 as an ESD protective element.

15 Claims, 17 Drawing Sheets

AMPLIFYING DEVICE

RELATED APPLICATIONS

This application is the U.S. National Phase under 35 U.S.C. §371 of International Application No. PCT/JP2007/071065, filed on Oct. 29, 2007, which in turn claims the benefit of Japanese Application No. 2006-295117, filed on Oct. 31, 2006, the disclosures of which Applications are incorporated by reference herein.

TECHNICAL FIELD

The present invention relates to an amplifying device comprising an ESD (Electrostatic Discharge) protective element or an ESD protective device, and particularly to an amplifying device connected to a signal source with high internal impedance.

BACKGROUND ART

An amplifying device connected to a signal source with high internal impedance is commonly used in the field of using a capacitive signal source such as a sound pressure sensor. A typical example of the sound pressure sensor includes a microphone, and a conventional art will be described by taking an electret condenser microphone (hereinafter called an ECM) as an example herein.

The ECM has been commonly used in a small portable device such as a mobile telephone. The condenser microphone is configured to oppose a diaphragm to an electrode and apply a voltage to the electrode from the outside and charge the electrode. By this configuration, a displacement of the diaphragm by a sound pressure results in a change in capacitance between the diaphragm and the electrode and results in a change in potential between the diaphragm and the electrode.

The condenser microphone converts a sound into an electrical signal by fetching this change in potential as the electrical signal. An electret in which semipermanent polarization is caused inside a dielectric such as a polymeric material and electric charges are held on the surface is used in an electrode of a condenser microphone and thereby, the ECM eliminates the need for application of a voltage from the outside.

Characteristics or sensitivity of the ECM depends on capacitance between the diaphragm and the electrode, and the output is proportional to amplitude of the diaphragm. The capacitance of the ECM depends on sizes of the diaphragm and the electrode and a structure between the diaphragm and the electrode, and is generally about several pF to several tens of pF. Also, frequency characteristics become flat from lower frequency as load resistance is large. Therefore, it is necessary to set the load resistance at an extremely large value in order to flatten the frequency characteristics at a voice band (20 Hz to 20 kHz). Hence, a CMOS amplifier or a field effect transistor with extremely high input impedance is used in the load resistance of the ECM.

On the other hand, when the input impedance is too high, a problem that response time returning to a desired DC operating voltage after detecting a loud voice or turning on a power source of the ECM becomes late arises, so that the input impedance is generally set at about several GΩ to several tens of GΩ.

A method for constructing an equivalent high resistance monolithically using a minute current of a sub-threshold region of a MOS transistor has been used conventionally in the case of attempting to incorporate a resistance of several GΩ to several tens of GΩ into the same chip of a CMOS amplifier. This art used conventionally will be described using FIGS. 11 and 12.

FIG. 11 is a circuit example of a CMOS amplifier used in the ECM, and FIG. 12 is an example of an amplifying device in which input impedance is set at several GΩ to several tens of GΩ using a sub-threshold region of an N-channel MOS transistor.

In FIG. 11, 1 is a positive input terminal, and 2 is a negative input terminal, and 3 is a first output terminal, and 4 is a first P-channel MOS transistor, and 5 is a second P-channel MOS transistor, and 6 is a third P-channel MOS transistor, and 7 is a fourth P-channel MOS transistor, and 8 is a first N-channel MOS transistor, and 9 is a second N-channel MOS transistor, and 10 is a third N-channel MOS transistor, and 11 is a fourth N-channel MOS transistor, and 12 is a first resistor, and 13 is a second resistor, and 14 is a third resistor, and 15 is a first current source, and 16 is second current source, and 17 is a third current source, and 18 is a power source terminal, and 19 is an earth terminal.

A differential circuit is constructed of the first P-channel MOS transistor 4 and the second P-channel MOS transistor 5, and signals inputted from the positive input terminal 1 and the negative input terminal 2 are amplified by the first resistor 12, the second resistor 13 and the third P-channel MOS transistor 6, the fourth P-channel MOS transistor 7, the first N-channel MOS transistor 8, the second N-channel MOS transistor 9, the fourth N-channel MOS transistor 11, and are outputted from the first output terminal 3.

In FIG. 12, 20 is a CMOS amplifier circuit shown in FIGS. 11 and 21 is an input terminal, and 22 is a second output terminal, and 23 is a feedback circuit, and 24 is a voltage source, and 25 is a fifth N-channel MOS transistor, and 26 is a sixth N-channel MOS transistor. In addition, the same numerals are assigned to the means having the same action and effect described in FIG. 11, and the detailed description is omitted.

The amplifying device of FIG. 12 is the example using the feedback circuit 23, and the input impedance is set at several GΩ to several tens of GΩ by using the fifth N-channel MOS transistor 25 and the sixth N-channel MOS transistor 26 in the sub-threshold region.

The ECM is connected to the input terminal 21 and frequency characteristics become flat to a voice band by high input impedance of a CMOS amplifier and the input impedance is set at several GΩ to several tens of GΩ and thereby, response time after detecting a loud voice or turning on a power source of the ECM is speeded up and desired electrical characteristics are achieved.

DISCLOSURE OF THE INVENTION

Problems that the Invention is to Solve

However, in the amplifying device of the conventional configuration, desired electrical characteristics required by the ECM are satisfied, but it is necessary to set the input impedance at several GΩ to several tens of GΩ, so that it configures to be received by a gate of a MOS with a low ESD (Electrostatic Discharge) withstand current rating. Also, the input impedance reduces when an ESD protective element such as a diode is connected to the input terminal 21 in order to prevent an ESD breakdown. Since signal characteristics from the ECM connected to the input terminal 21 cannot be detected unless the input impedance is held high in the input terminal 21, the element (such as the ESD protective element) for reducing the input impedance could not be connected to the input terminal 21.

As a result of this, in the input terminal 21, the ESD withstand current rating is extremely low and the ESD withstand current rating of MM standards becomes about 20 V to 30 V generally. Since the ECM is connected to the input terminal 21, in the case of being configured as an ECM module, the ECM is not exposed to the outside of the module, but in its manufacturing process, special handling or process management is required in order to pat sufficient attention to the ESD breakdown and a manufacturing method becomes very complicated. In addition, the MM standards refer to machine model standards, and the machine model is an ESD model assuming that an electrostatic breakdown occurs because a charged metal of a device handler etc. touches a semiconductor device.

The invention solves the conventional problem described above, and an object of the invention is to provide an amplifying device for setting input impedance at several GΩ to several tens of GΩ and improving an ESD withstand current rating.

Means for Solving the Problems

In order to attain this object, an amplifying device of the invention is an amplifying device which comprises an amplifying circuit, a voltage source and a high-resistance circuit and connects an input terminal of the amplifying circuit to an output terminal of the voltage source through the high-resistance circuit and amplifies a signal inputted from the input terminal according to an output voltage of the voltage source, and is characterized in that an ESD protective element is connected to the output terminal of the voltage source.

According to the configuration described above, input impedance is set at several GΩ to several tens of GΩ and desired electrical characteristics are satisfied and an ESD withstand current rating can be improved, so that the need for special handling or management in manufacturing is eliminated and manufacturing lead time and cost can be reduced.

Also, the amplifying device of the invention is characterized in that the high-resistance circuit is constructed of a MOS transistor and the ESD protective element is constructed so that a drain of an N-channel MOS transistor and a drain of a P-channel MOS transistor are connected to an output terminal of the voltage source and a gate and a source of the N-channel MOS transistor are connected to a low-potential power source terminal and a gate and a source of the P-channel MOS transistor are connected to a high-potential power source terminal.

According to the configuration described above, the high-resistance circuit is constructed of a MOS transistor and the ESD protective element is constructed of P-channel and N-channel MOS transistors and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a MOS transistor and the ESD protective element is constructed so that a drain of an N-channel MOS transistor is connected to an output terminal of the voltage source and a gate and a source of the N-channel MOS transistor are connected to a low-potential power source terminal.

According to the configuration described above, the high-resistance circuit is constructed of a MOS transistor and the ESD protective element is constructed of an N-channel MOS transistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a bipolar transistor and the ESD protective element is constructed so that a drain of an N-channel MOS transistor and a drain of a P-channel MOS transistor are connected to an output terminal of the voltage source and a gate and a source of the N-channel MOS transistor are connected to a low-potential power source terminal and a gate and a source of the P-channel MOS transistor are connected to a high-potential power source terminal.

According to the configuration described above, the high-resistance circuit is constructed of a bipolar transistor and the ESD protective element is constructed of P-channel and N-channel MOS transistors and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a bipolar transistor and the ESD protective element is constructed so that a drain of an N-channel MOS transistor is connected to an output terminal of the voltage source and a gate and a source of the N-channel MOS transistor are connected to a low-potential power source terminal.

According to the configuration described above, the high-resistance circuit is constructed of a bipolar transistor and the ESD protective element is constructed of an N-channel MOS transistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a diode and the ESD protective element is constructed so that a drain of an N-channel MOS transistor and a drain of a P-channel MOS transistor are connected to an output terminal of the voltage source and a gate and a source of the N-channel MOS transistor are connected to a low-potential power source terminal and a gate and a source of the P-channel MOS transistor are connected to a high-potential power source terminal.

According to the configuration described above, the high-resistance circuit is constructed of a diode and the ESD protective element is constructed of P-channel and N-channel MOS transistors and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a diode and the ESD protective element is constructed so that a drain of an N-channel MOS transistor is connected to an output terminal of the voltage source and a gate and a source of the N-channel MOS transistor are connected to a low-potential power source terminal.

According to the configuration described above, the high-resistance circuit is constructed of a diode and the ESD protective element is constructed of an N-channel MOS transistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a bipolar transistor and the ESD protective element is constructed so that a collector of an NPN transistor is connected to an output terminal of the voltage source and an emitter and a base of the NPN transistor are connected to a low-potential power source terminal.

According to the configuration described above, the high-resistance circuit is constructed of a bipolar transistor and the ESD protective element is constructed of an NPN transistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a bipolar transistor and the ESD protective element is constructed so that a collector of an NPN transistor is connected to an output terminal of the voltage source and an emitter of the NPN transistor is connected to a low-potential power source terminal and a base of the NPN transistor is connected to the low-potential power source terminal through a resistor.

According to the configuration described above, the high-resistance circuit is constructed of a bipolar transistor and the ESD protective element is constructed of an NPN transistor and a resistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a bipolar transistor and the ESD protective element is constructed so that a cathode of a first diode and an anode of a second diode are connected to an output terminal of the voltage source and an anode of the first diode is connected to a low-potential power source terminal and a cathode of the second diode is connected to a high-potential power source terminal.

According to the configuration described above, the high-resistance circuit is constructed of a bipolar transistor and the ESD protective element is constructed of a diode and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a diode and the ESD protective element is constructed so that a collector of an NPN transistor is connected to an output terminal of the voltage source and an emitter and a base of the NPN transistor are connected to a low-potential power source terminal.

According to the configuration described above, the high-resistance circuit is constructed of a diode and the ESD protective element is constructed of an NPN transistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a diode and the ESD protective element is constructed so that a collector of an NPN transistor is connected to an output terminal of the voltage source and an emitter of the NPN transistor is connected to a low-potential power source terminal and a base of the NPN transistor is connected to the low-potential power source terminal through a resistor.

According to the configuration described above, the high-resistance circuit is constructed of a diode and the ESD protective element is constructed of an NPN transistor and a resistor and thereby, input impedance is set at several GΩ to several tens of GΩ and desired electrical characteristics are satisfied and an ESD withstand current rating can be improved.

Also, the amplifying device of the invention is characterized in that the high-resistance circuit is constructed of a diode and the ESD protective element is constructed so that a cathode of a first diode and an anode of a second diode are connected to an output terminal of the voltage source and an anode of the first diode is connected to a low-potential power source terminal and a cathode of the second diode is connected to a high-potential power source terminal.

According to the configuration described above, the high-resistance circuit is constructed of a diode and the ESD protective element is constructed of a diode and thereby, input impedance is set at several GΩ to several tens of GΩ and desired electrical characteristics are satisfied and an ESD withstand current rating can be improved.

Also, the amplifying device of the invention is characterized in that a capacitive signal source is connected to an input terminal of the amplifying circuit.

According to the configuration described above, by connecting a large load resistor, frequency characteristics of a voice band can be flattened.

Also, the amplifying device of the invention is characterized in that the capacitive signal source is an electret condenser microphone.

According to the configuration described above, an electret in which semipermanent polarization is caused inside a dielectric such as a polymeric material and electric charges are held on the surface is used in an electrode and thereby, the need for application of a voltage from the outside is eliminated and use can be made in a small portable device such as a mobile telephone.

Also, the amplifying device of the invention is characterized in that the amplifying circuit is a CMOS amplifier with high input impedance.

According to the configuration described above, frequency characteristics become flat to a voice band with respect to a signal from a microphone and the input impedance is set at several GΩ to several tens of GΩ and thereby, response time after detecting a loud voice or turning on a power source is speeded up and desired electrical characteristics can be achieved.

Advantage Of The Invention

According to an amplifying device according to the invention, input impedance can be set at several GΩ to several tens of GΩ, so that desired electrical characteristics are satisfied and an ESD withstand current rating is improved and thereby, the need for special handling or management in manufacturing is eliminated, so that manufacturing lead time and cost can be reduced.

DESCRIPTION OF REFERENCE NUMERALS AND SIGNS

1 POSITIVE INPUT TERMINAL
1 NEGATIVE INPUT TERMINAL
2 FIRST OUTPUT TERMINAL
3 FIRST P-CHANNEL MOS TRANSISTOR
4 SECOND P-CHANNEL MOS TRANSISTOR
5 THIRD P-CHANNEL MOS TRANSISTOR
6 FOURTH P-CHANNEL MOS TRANSISTOR
7 FIRST N-CHANNEL MOS TRANSISTOR
8 SECOND N-CHANNEL MOS TRANSISTOR
9 THIRD N-CHANNEL MOS TRANSISTOR
10 FOURTH N-channel MOS transistor
11 FIRST RESISTOR
12 SECOND RESISTOR
13 THIRD RESISTOR
14 FIRST CURRENT SOURCE
15 SECOND CURRENT SOURCE
16 THIRD CURRENT SOURCE
17 POWER SOURCE TERMINAL
18 EARTH TERMINAL
19 CMOS AMPLIFIER CIRCUIT
20 INPUT TERMINAL
21 SECOND OUTPUT TERMINAL
22 FEEDBACK CIRCUIT
23 VOLTAGE SOURCE
24 FIFTH N-channel MOS transistor
25 SIXTH N-channel MOS transistor
26 FIFTH P-CHANNEL MOS TRANSISTOR
27 SEVENTH N-CHANNEL MOS TRANSISTOR
28 FIRST NPN TRANSISTOR
29 SECOND NPN TRANSISTOR
30 FIRST DIODE
31 SECOND DIODE
32 THIRD NPN TRANSISTOR
33 FOURTH RESISTOR
34 THIRD DIODE
35 FOURTH DIODE
36 N-CHANNEL MOS TRANSISTOR BETWEEN POWER SOURCE TERMINAL 18 AND EARTH TERMINAL 19

BEST MODE FOR CARRYING OUT THE INVENTION

Figure 1A:
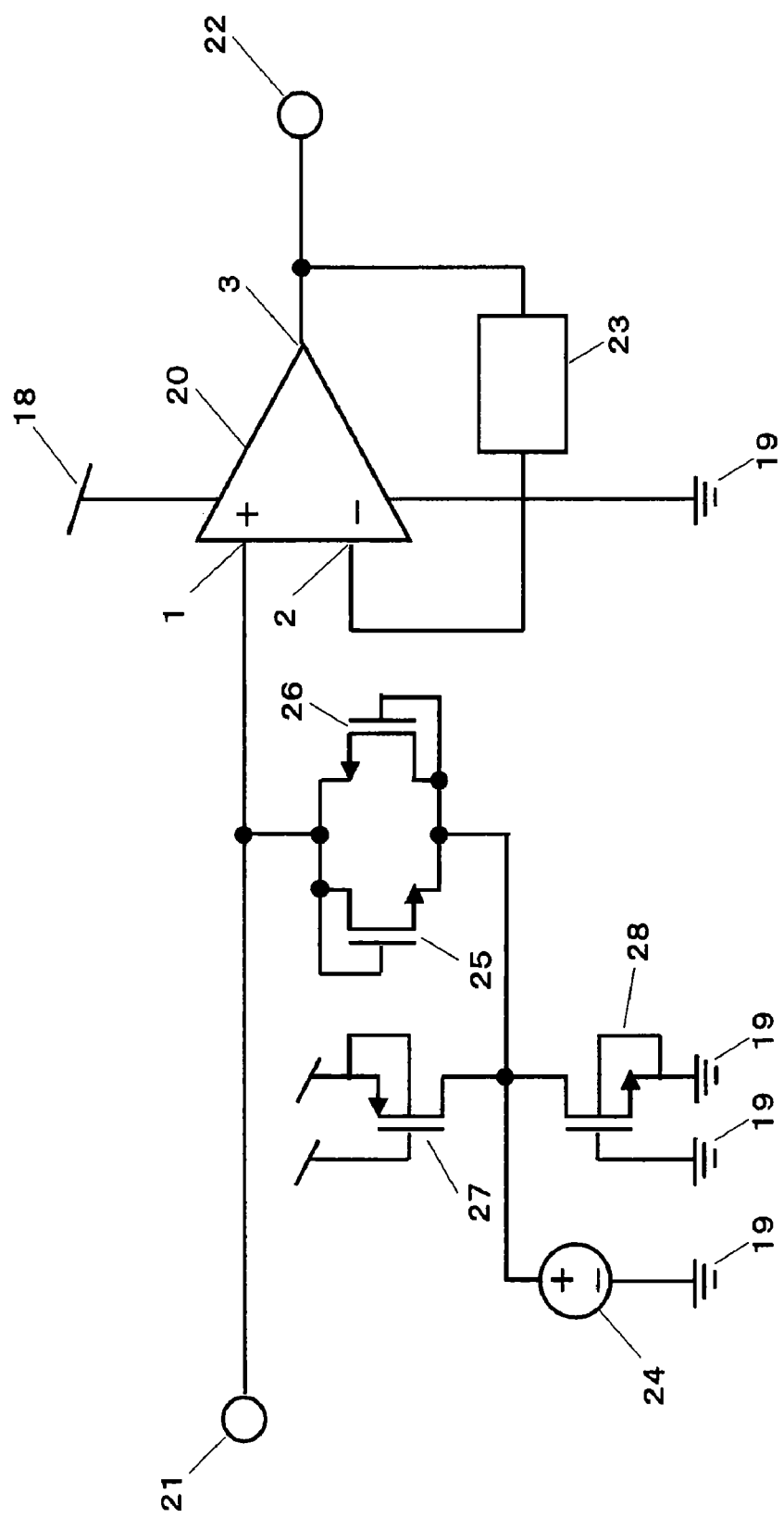
FIG. 1A is a diagram describing an amplifying device (1) according to an embodiment of the invention.
Figure 11:
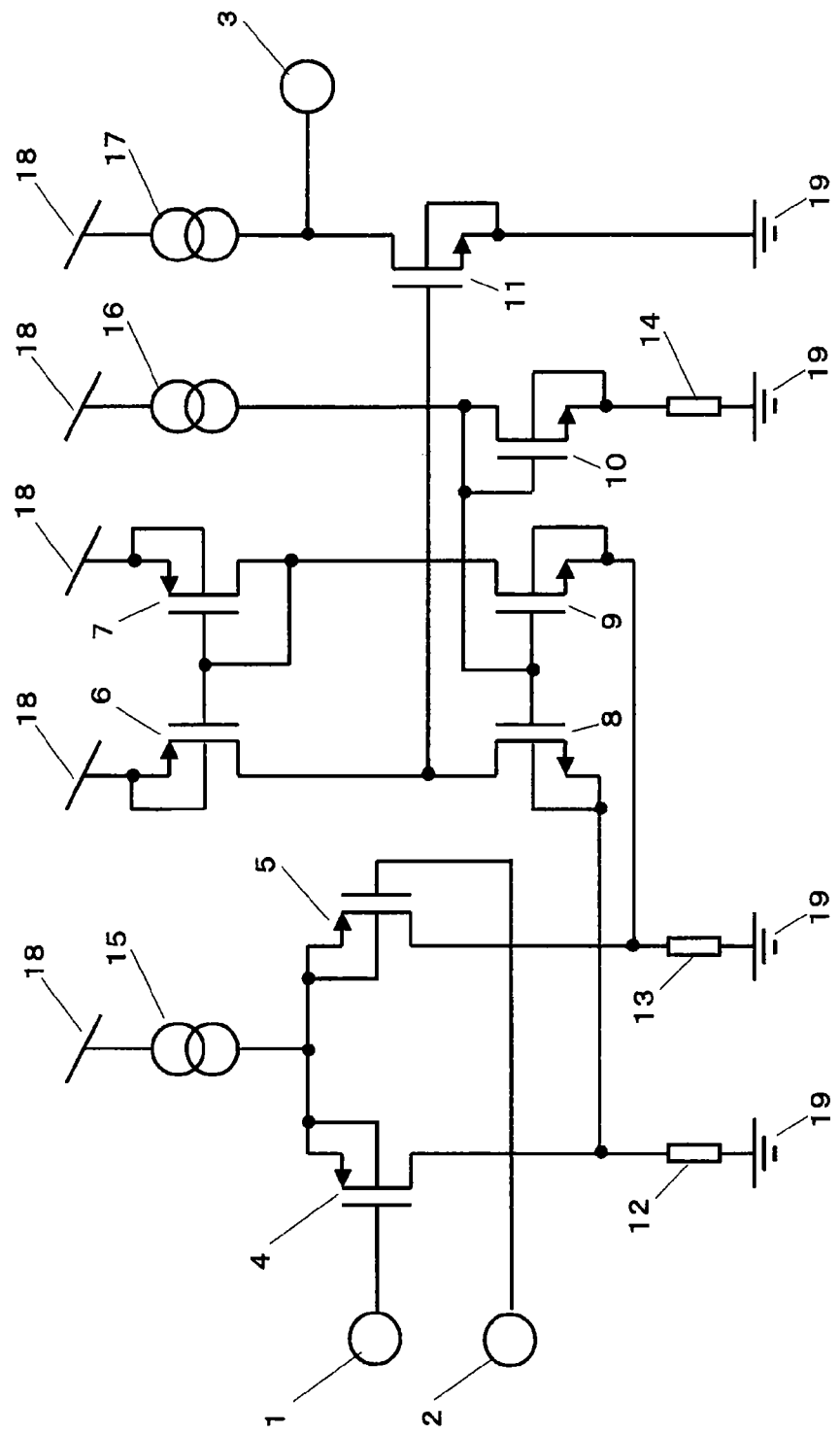
FIG. 11 is a diagram describing a conventional CMOS amplifier circuit.
Figure 12:
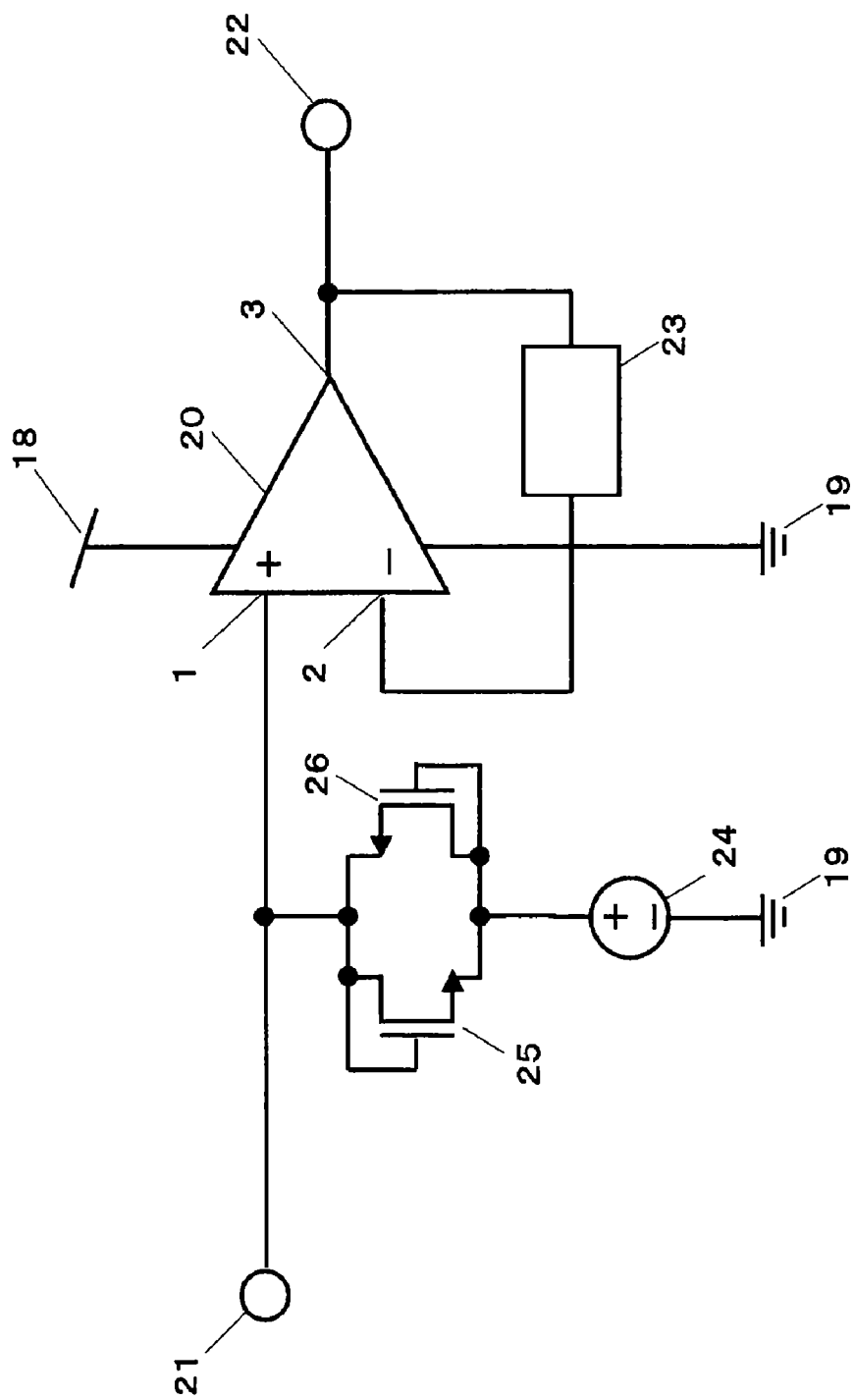
FIG. 12 is a diagram describing a conventional amplifying device.

Next, amplifying devices in examples of the invention will be described in detail with reference to the drawings. FIG. 1A is a diagram describing an amplifying device (1) according to an embodiment of the invention. In addition, the same numerals are assigned to the means having the same action and effect as those described in FIGS. 11 to 12, and the detailed description is omitted.

In a configuration of FIG. 1A, 27 is a fifth P-channel MOS transistor, and 28 is a seventh N-channel MOS transistor. In the configuration of FIG. 1A, input impedance is set at several GΩ to several tens of GΩ by using a fifth N-channel MOS transistor 25 and a sixth N-channel MOS transistor 26 in a sub-threshold region.

An ECM is connected to an input terminal 21 and frequency characteristics become flat to a voice band by high input impedance of a CMOS amplifier and the input impedance is set at several GΩ to several tens of GΩ and thereby, response time after detecting a loud voice or turning on a power source of the ECM is speeded up and desired electrical characteristics are achieved.

Further, a path for releasing a surge voltage which occurs during assembly in the outside of an IC and intrudes from the input terminal 21 to a power source terminal 18 or an earth terminal 19 without an influence on a signal (20 Hz to 20 kHz) of a voice band entering from the input terminal 21 can be constructed by connecting the fifth P-channel MOS transistor 27 and the seventh N-channel MOS transistor 28 to an output terminal of a voltage source 24 as an ESD protective element. A current emission path of the case where the surge voltage intrudes from the input terminal 21 will hereinafter be described in each of the case based on the earth terminal 19 and the case based on the power source terminal 18 with reference to FIGS. 1B and 1C.

Figure 1B:
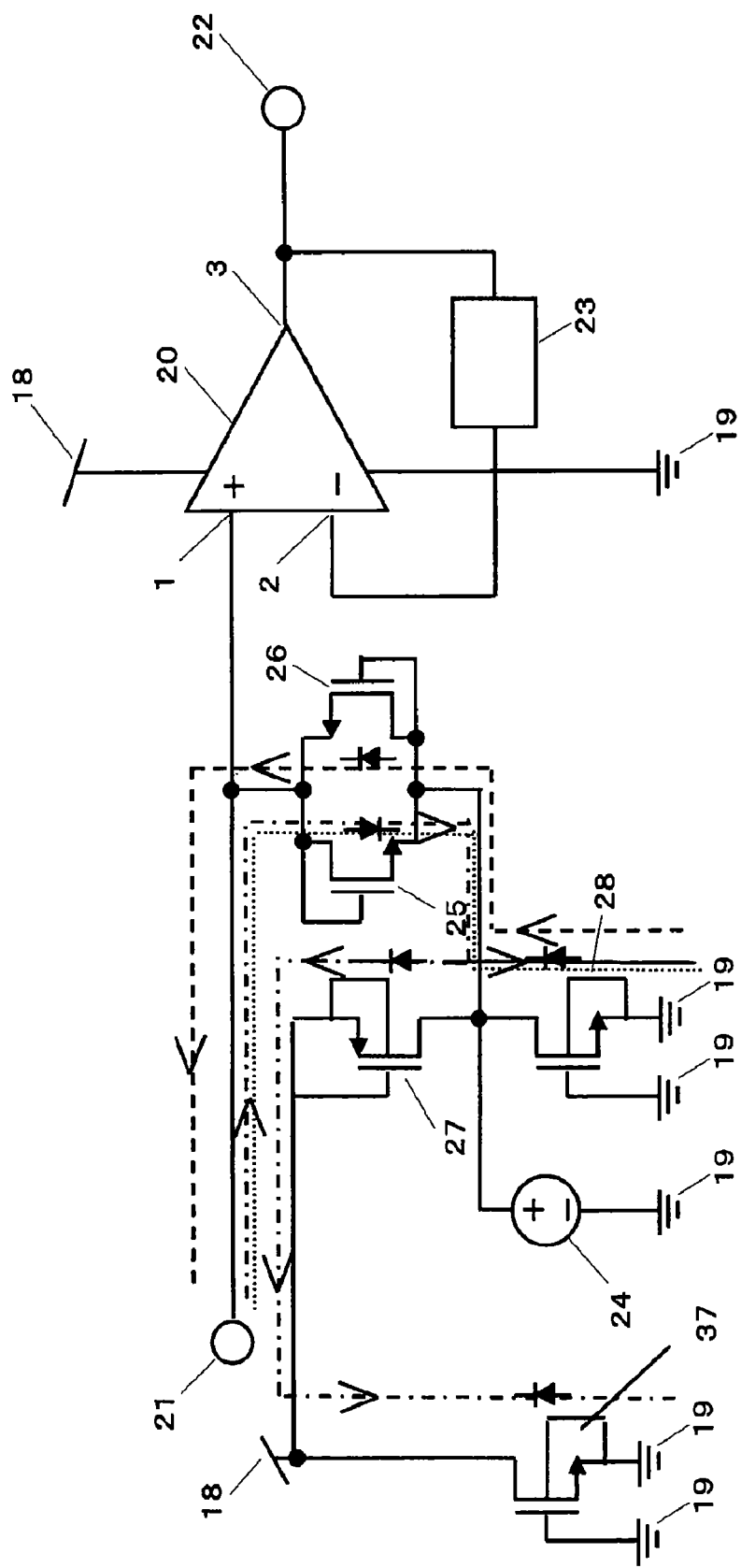
FIG. 1B is a diagram (1) describing a surge current emission path in the amplifying device (1) according to the embodiment of the invention.
Figure 1C:
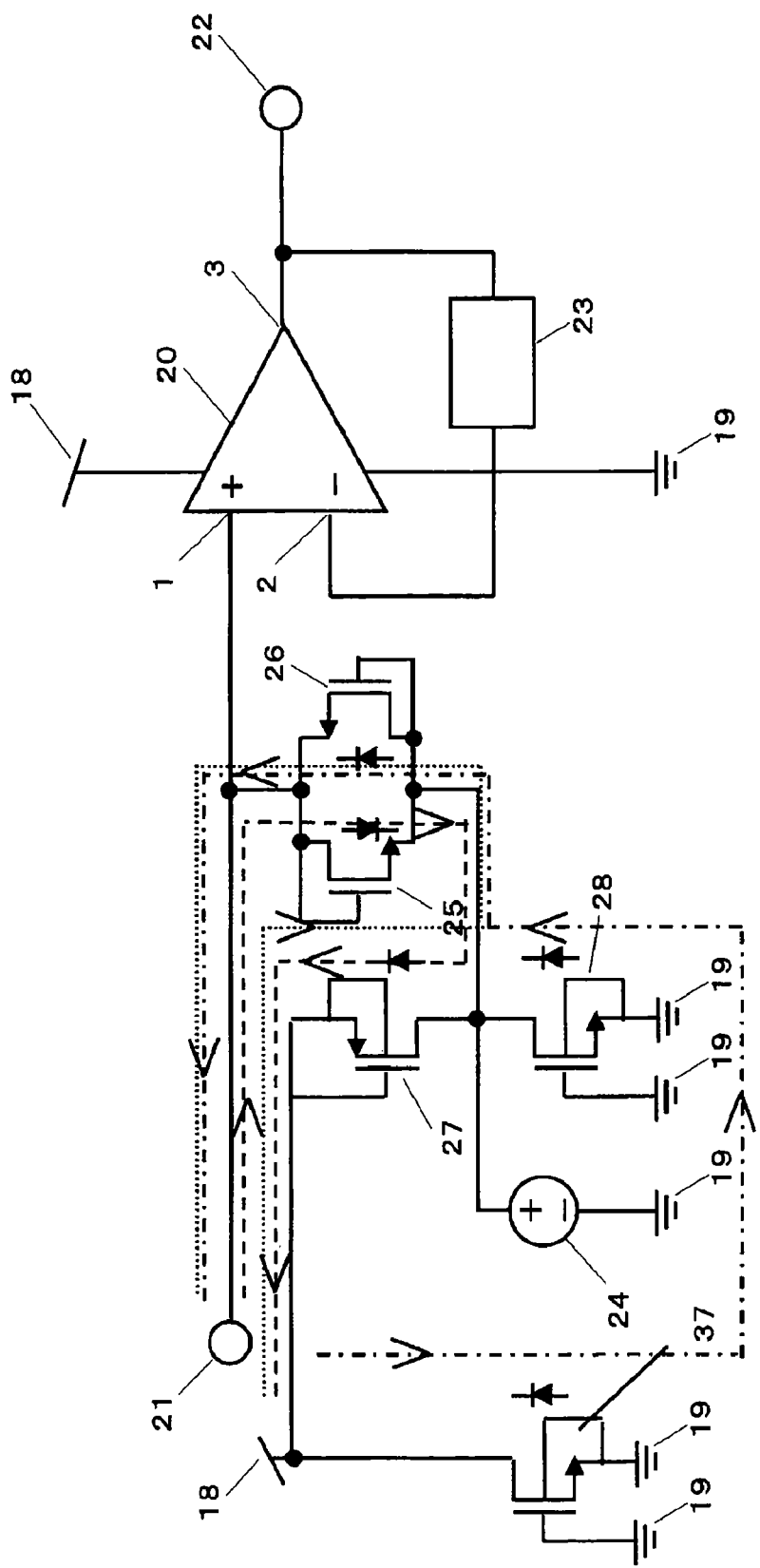
FIG. 1C is a diagram (2) describing a surge current emission path in the amplifying device (1) according to the embodiment of the invention.

FIGS. 1B and 1C show equivalent circuits of FIG. 1A, and are diagrams showing the current emission paths of the case where the surge voltage intrudes from the input terminal 21 in the amplifying device shown in FIG. 1A. FIG. 1B shows the surge current emission path in the case based on the earth terminal 19, and FIG. 1C shows the surge current emission path in the case based on the power source terminal 18. In FIGS. 1B and 1C, an N-channel MOS transistor 37 (not shown in FIG. 1A) between the power source terminal 18 and the earth terminal 19 is expressed clearly. Also, in FIGS. 1B and 1C, a diode component of each of the MOS transistors 25 to 28, 37 is represented.

When a positive surge voltage is applied to the input terminal 21 based on the earth terminal 19, a current flows from the input terminal 21 to the earth terminal 19 by a breakdown of the N-channel transistor 37 between the power source terminal 18 and the earth terminal 19 via the fifth N-channel MOS transistor 25 and the fifth P-channel MOS transistor 27 as shown by a chain line in FIG. 1B. Also, when the positive surge voltage is applied to the input terminal 21 based on the earth terminal 19, a current may flow from the input terminal 21 to the earth terminal 19 by a breakdown of the seventh N-channel MOS transistor 28 via the fifth N-channel MOS transistor 25 as shown by a dotted line in FIG. 1B. On the other hand, when a negative surge voltage is applied to the input terminal 21 based on the earth terminal 19, a current flows from the earth terminal 19 to the input terminal 21 via the seventh N-channel MOS transistor 28 and the sixth N-channel MOS transistor 26 as shown by a broken line in FIG. 1C.

When a positive surge voltage is applied to the input terminal 21 based on the power source terminal 18, a current flows from the input terminal 21 to the power source terminal 18 via the fifth N-channel MOS transistor 25 and the fifth P-channel MOS transistor 27 as shown by a broken line in FIG. 1C. On the other hand, when a negative surge voltage is applied to the input terminal 21 based on the power source terminal 18, a current flows from the power source terminal 18 to the input terminal 21 by a breakdown of the N-channel transistor 37 between the power source terminal 18 and the earth terminal 19 via the seventh N-channel MOS transistor 28 and the sixth N-channel MOS transistor 26 as shown by a chain line in FIG. 1C. Also, when the negative surge voltage is applied to the input terminal 21 based on the power source terminal 18, a current may flow from the power source terminal 18 to the input terminal 21 by a breakdown of the fifth P-channel MOS transistor 27 via the sixth N-channel MOS transistor 26 as shown by a dotted line in FIG. 1C.

By the configuration described above, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

According to the amplifying device of the embodiment thus, by properly setting a position in which the ESD protective element is connected, a decrease in the input impedance can be avoided and the ESD withstand current rating can be increased to about 70 to 80 V.

In addition, since the ESD withstand current rating depends on allowable current values of the fifth N-channel MOS transistor 25 and the sixth N-channel MOS transistor 26, it is necessary to set sizes of the fifth N-channel MOS transistor 25 and the sixth N-channel MOS transistor 26 so that the input impedance is several GΩ to several tens of GΩ and the ESD withstand current rating without requiring special handling or management in manufacturing is obtained according to characteristics of an element.

Also, in FIGS. 1A to 1C, the example in which 25 and 26 are the N-channel MOS transistors is shown, but the same effect is obtained even in respective P-channel MOS transistors and this is included in the examples of the invention.

Figure 2A:
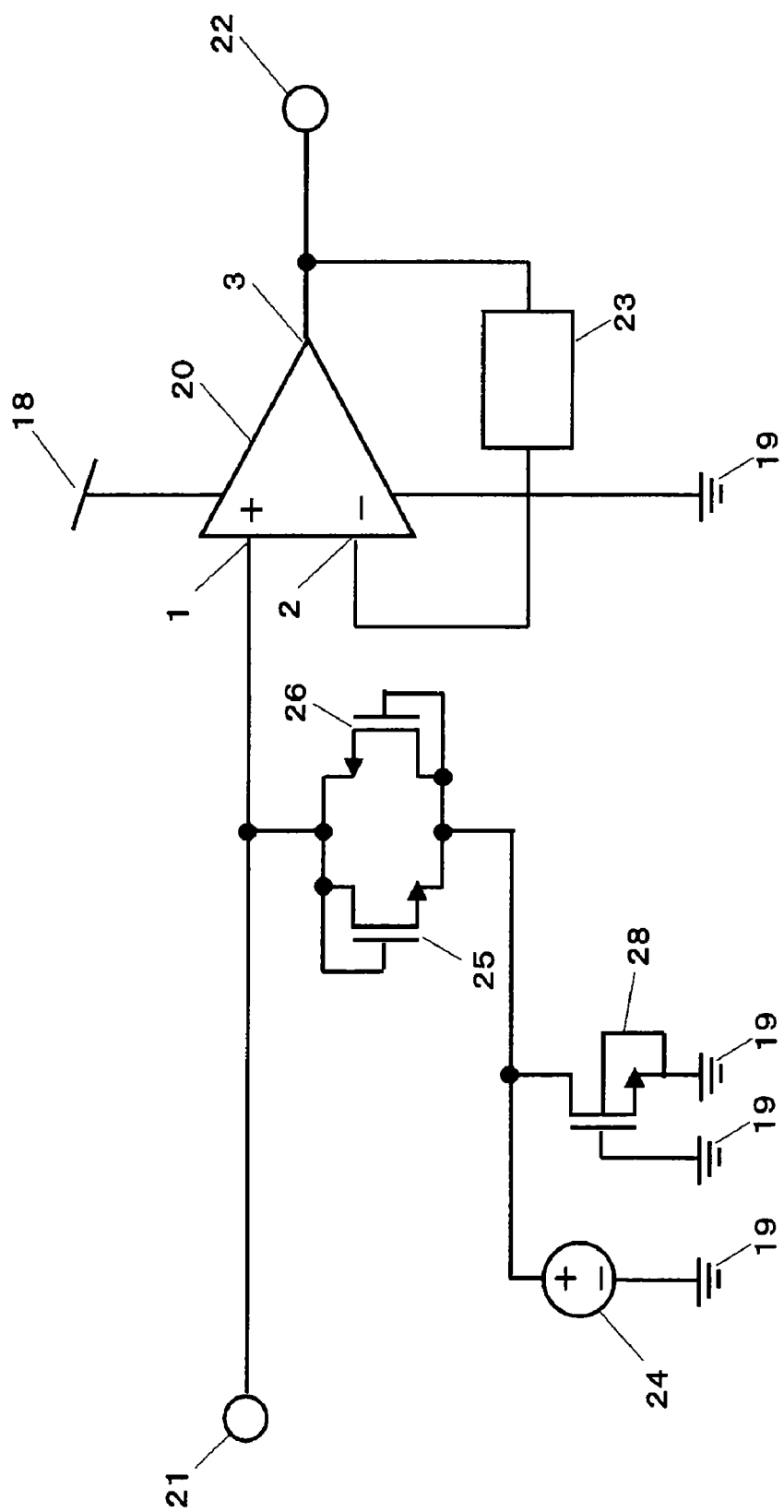
FIG. 2A is a diagram describing an amplifying device (2) according to an embodiment of the invention.

FIG. 2A is a diagram describing an amplifying device (2) according to an embodiment of the invention. In addition, the same numerals are assigned to the means having the same action and effect as those described in FIGS. 1A to 1C and FIGS. 11 to 12, and the detailed description is omitted. The amplifying device shown in FIG. 2A is an apparatus excluding the fifth P-channel MOS transistor 27 in the configuration shown in FIGS. 1A to 1C.

In the amplifying device of a configuration of FIG. 2A, a path for releasing a surge voltage to a power source terminal 18 or an earth terminal 19 without an influence on a signal (20 Hz to 20 kHz) of a voice band entering from an input terminal 21 can be constructed by connecting a seventh N-channel MOS transistor 28 to an output terminal of a voltage source 24 as an ESD protective element. A current emission path of the case where the surge voltage intrudes from the input terminal 21 will hereinafter be described in each of the case based on the earth terminal 19 and the case based on the power source terminal 18 with reference to FIGS. 2B and 2C.

Figure 2B:
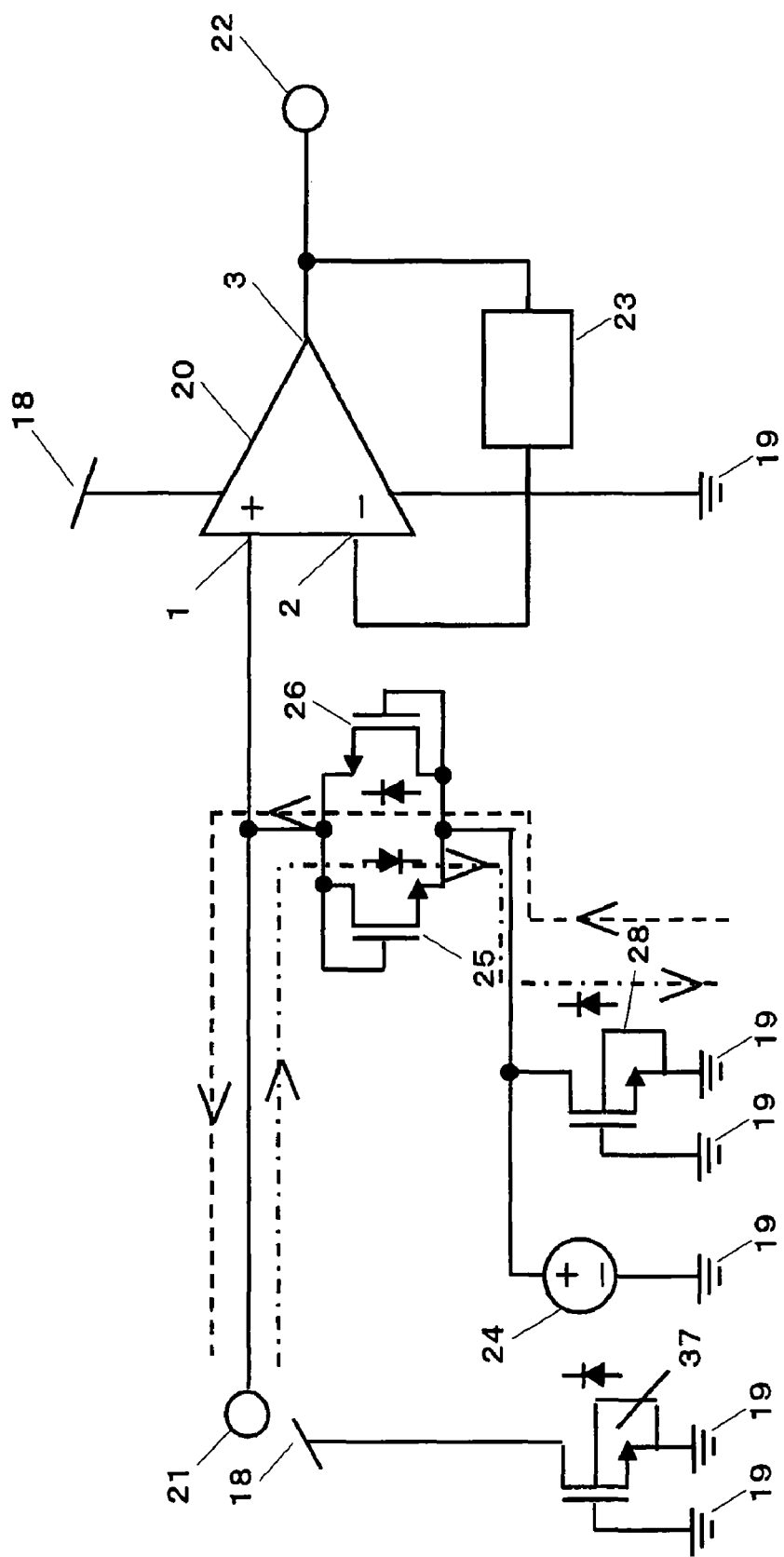
FIG. 2B is a diagram (1) describing a surge current emission path in the amplifying device (2) according to the embodiment of the invention.
Figure 2C:
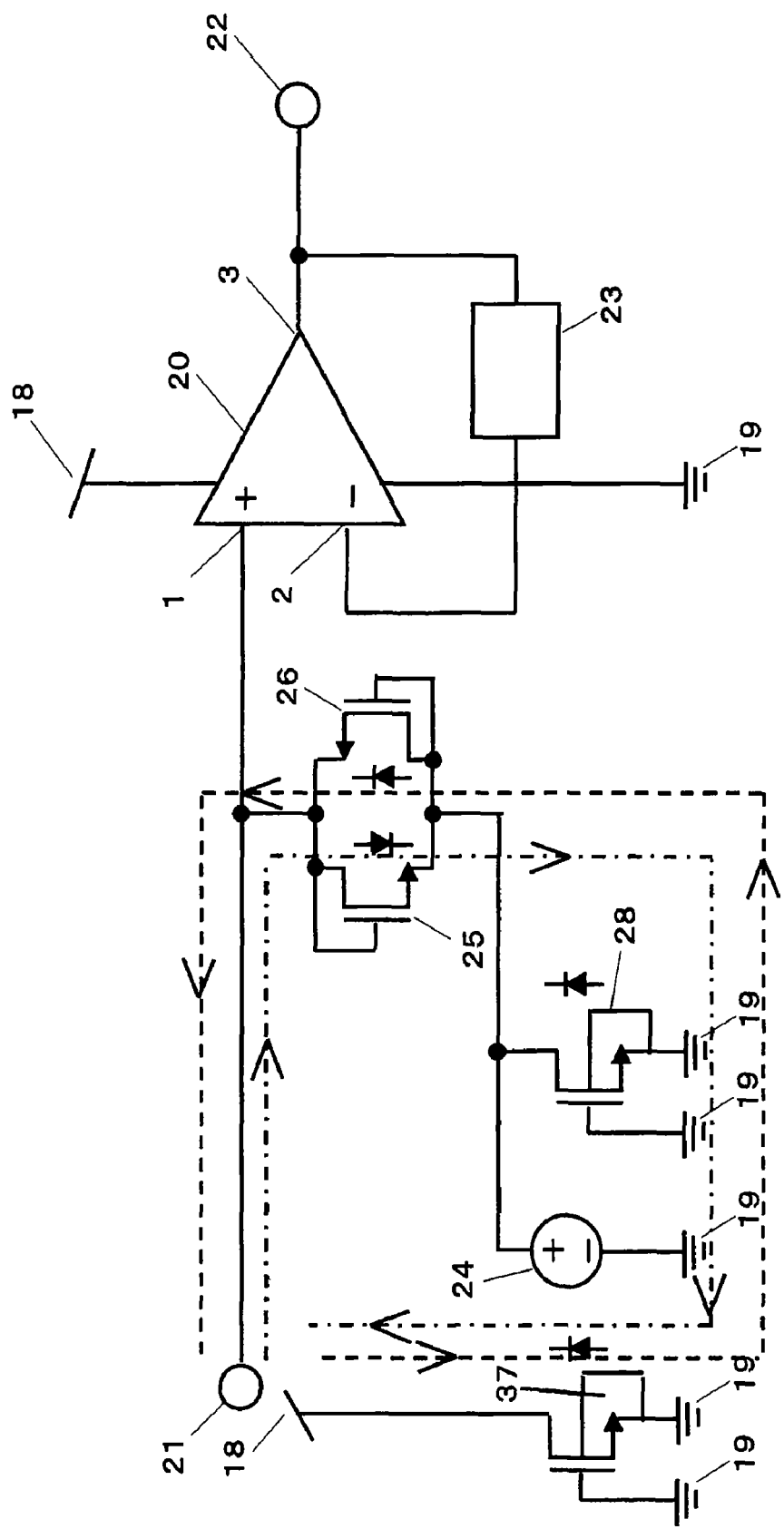
FIG. 2C is a diagram (2) describing a surge current emission path in the amplifying device (2) according to the embodiment of the invention.

FIGS. 2B and 2C show equivalent circuits of FIG. 2A, and are diagrams showing the current emission paths of the case where the surge voltage intrudes from the input terminal 21 in the amplifying device shown in FIG. 2A. FIG. 2B shows the surge current emission path in the case based on the earth terminal 19, and FIG. 2C shows the surge current emission path in the case based on the power source terminal 18. In FIGS. 2B and 2C, an N-channel MOS transistor 37 (not shown in FIG. 2A) between the power source terminal 18 and the earth terminal 19 is expressed clearly. Also, in FIGS. 2B and 2C, a diode component of each of the MOS transistors 25, 26, 28, 37 is represented.

When a positive surge voltage is applied to the input terminal 21 based on the earth terminal 19, a current flows from the input terminal 21 to the earth terminal 19 by a breakdown of a seventh N-channel MOS transistor 28 via a fifth N-channel MOS transistor 25 as shown by a chain line in FIG. 2B. On the other hand, when a negative surge voltage is applied to the input terminal 21 based on the earth terminal 19, a current flows from the earth terminal 19 to the input terminal 21 via the seventh N-channel MOS transistor 28 and a sixth N-channel MOS transistor 26 as shown by a broken line in FIG. 2B.

When a positive surge voltage is applied to the input terminal 21 based on the power source terminal 18, a current flows from the input terminal 21 to the power source terminal 18 via the fifth N-channel MOS transistor 25, a breakdown of the seventh N-channel MOS transistor 28 and the N-channel transistor 37 between the power source terminal 18 and the earth terminal 19 as shown by a chain line in FIG. 2C. On the other hand, when a negative surge voltage is applied to the input terminal 21 based on the power source terminal 18, a current flows from the power source terminal 18 to the input terminal 21 by a breakdown of the N-channel transistor 37 between the power source terminal 18 and the earth terminal 19 via the seventh N-channel MOS transistor 28 and the sixth N-channel MOS transistor 26 as shown by a broken line in FIG. 2C.

By the configuration described above, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

In FIGS. 2A to 2C, the example in which 25 and 26 are the N-channel MOS transistors is shown, but the same effect is obtained even in respective P-channel MOS transistors and this is included in the examples of the invention.

Figure 3:
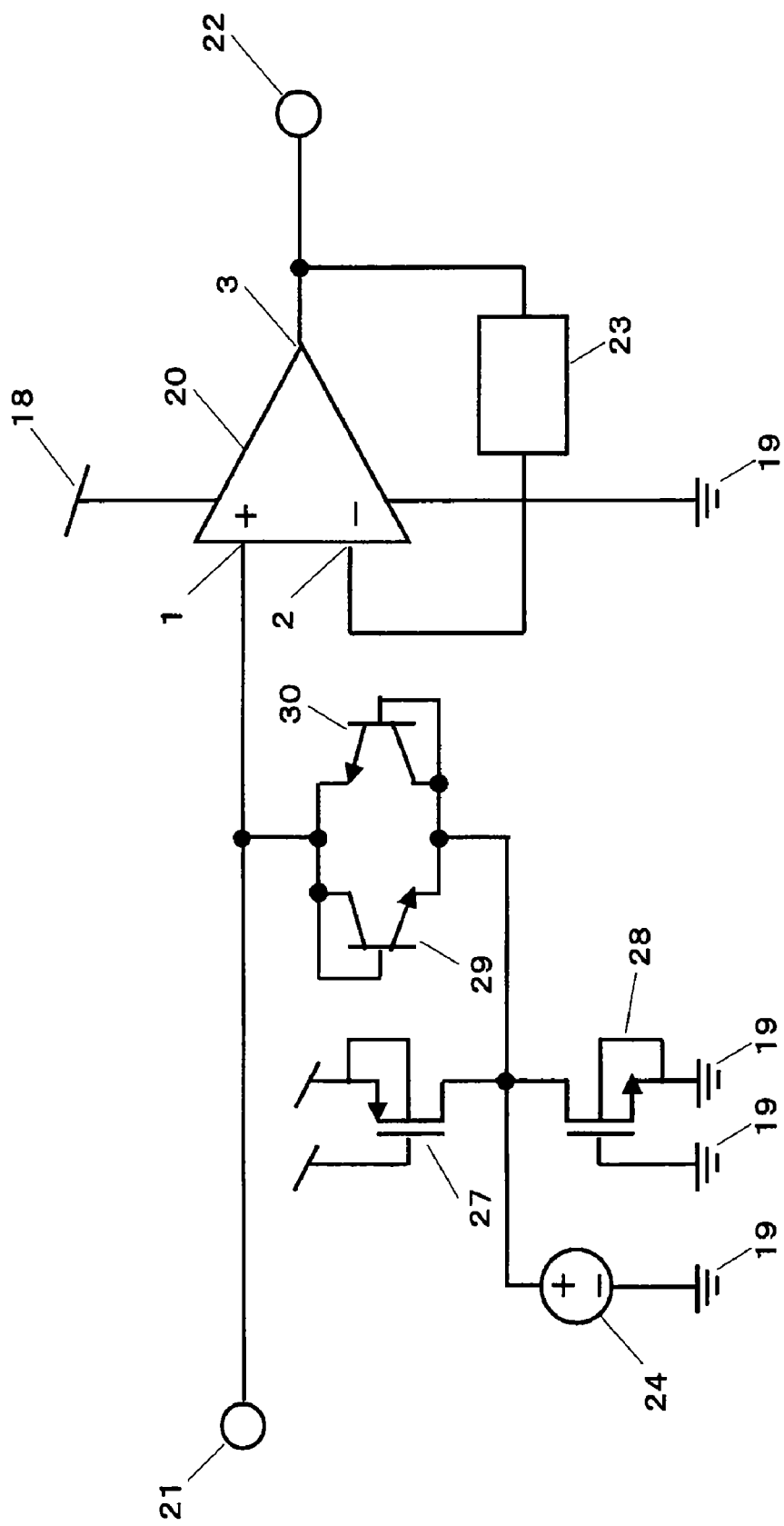
FIG. 3 is a diagram describing an amplifying device (3) according to an embodiment of the invention.

FIG. 3 is a diagram describing an amplifying device (3) according to an embodiment of the invention. In addition, the same numerals are assigned to the means having the same action and effect as those described in FIG. 1A, FIG. 2C and FIGS. 11 to 12, and the detailed description is omitted.

In a configuration of FIG. 3, 29 is a first NPN transistor, and 30 is a second NPN transistor. The amplifying device shown in FIG. 3 is an apparatus in which the fifth N-channel MOS transistor 25 and the sixth N-channel MOS transistor 26 are replaced with the first NPN transistor 29 and the second NPN transistor 30 in the configuration shown in FIG. 1. Also in the amplifying device of the configuration of FIG. 3, input impedance can be set at several GΩ to several tens of GΩ by using a minute current of the first NPN transistor 29 and the second NPN transistor 30 in a manner similar to the amplifying device shown in FIG. 1.

An ECM is connected to an input terminal 21 and frequency characteristics become flat to a voice band by high input impedance of a CMOS amplifier and the input impedance is set at several GΩ to several tens of GΩ and thereby, response time after detecting a loud voice or turning on a power source of the ECM is speeded up and desired electrical characteristics are achieved.

Further, a path for releasing a surge voltage to a power source terminal or an earth terminal without an influence on a signal (20 Hz to 20 kHz) of a voice band entering from the input terminal 21 can be constructed by connecting a fifth P-channel MOS transistor 27 and a seventh N-channel MOS transistor 28 to an output terminal of a voltage source 24 as an ESD protective element. A current emission path of the case where the surge voltage intrudes from the input terminal 21 is similar to that described with reference to FIGS. 1B and 1C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

In addition, since the ESD withstand current rating depends on allowable current values of the first NPN transistor 29 and the second NPN transistor 30, it is necessary to set sizes of the first NPN transistor 29 and the second NPN transistor 30 so that the input impedance is several GΩ to several tens of GΩ and the ESD withstand current rating without requiring special handling or management in manufacturing is obtained according to characteristics of an element.

Also, in FIG. 3, the example in which 29 and 30 are the NPN transistors is shown, but the same effect is obtained even in respective PNP transistors and this is included in the examples of the invention.

Figure 4:
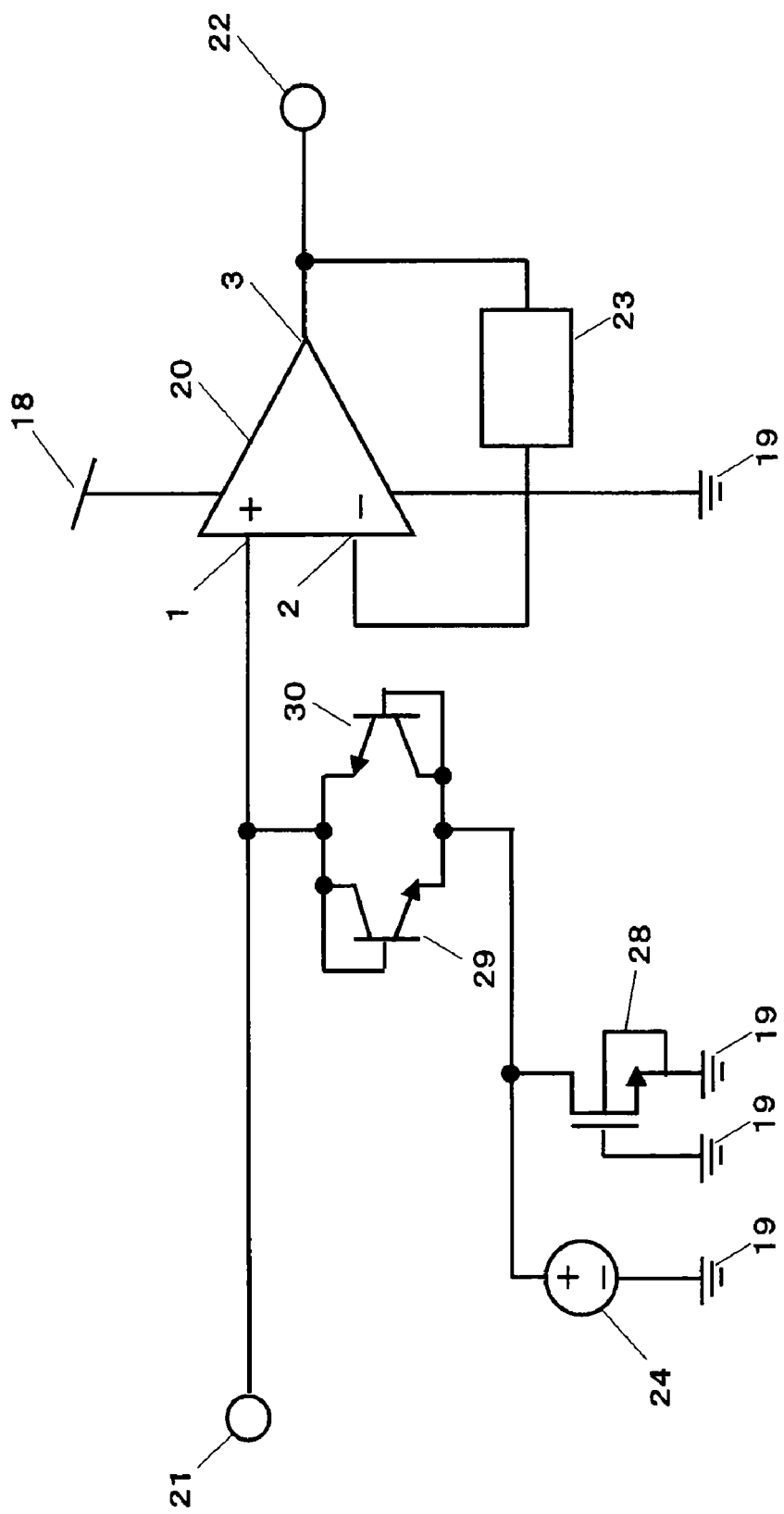
FIG. 4 is a diagram describing an amplifying device (4) according to an embodiment of the invention.

FIG. 4 is a diagram describing an amplifying device (4) according to an embodiment of the invention. The same numerals are assigned to the means having the same action and effect as those described in FIGS. 1A to 3 and FIGS. 11 to 12, and the detailed description is omitted. The amplifying device shown in FIG. 4 is an apparatus excluding the fifth P-channel MOS transistor 27 in the configuration shown in FIG. 3.

In the amplifying device of the configuration of FIG. 4, a path for releasing a surge voltage to a power source terminal or an earth terminal without an influence on a signal (20 Hz to 20 kHz) of a voice band entering from an input terminal 21 can be constructed by connecting a seventh N-channel MOS transistor 28 to an output terminal of a voltage source 24 as an ESD protective element. A current emission path of the case where the surge voltage intrudes from the input terminal 21 is similar to that described with reference to FIGS. 2B and 2C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

In FIG. 4, the example in which 29 and 30 are NPN transistors is shown, but the same effect is obtained even in respective PNP transistors and this is included in the examples of the invention.

Figure 5:
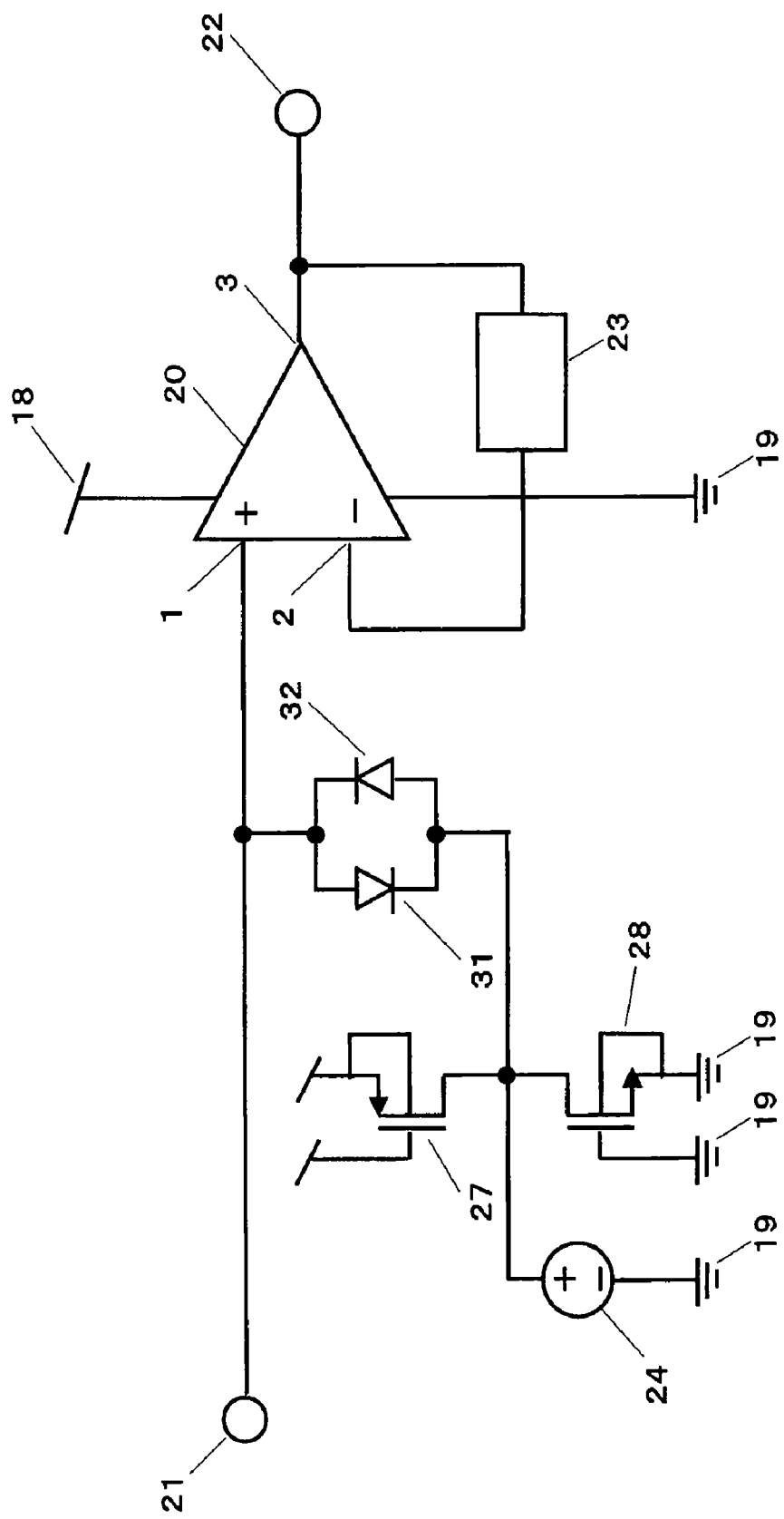
FIG. 5 is a diagram describing an amplifying device (5) according to an embodiment of the invention.

FIG. 5 is a diagram describing an amplifying device (5) according to an embodiment of the invention. The same numerals are assigned to the means having the same action and effect as those described in FIGS. 1A to 4 and FIGS. 11 to 12, and the detailed description is omitted.

In a configuration of FIG. 5, 31 is a first diode, and 32 is a second diode. The amplifying device shown in FIG. 5 is an apparatus in which the fifth N-channel MOS transistor 25 and the sixth N-channel MOS transistor 26 are replaced with the first diode 31 and the second diode 32 in the configuration shown in FIG. 1. Also in the amplifying device of the configuration of FIG. 5, input impedance can be set at several GΩ to several tens of GΩ by using a minute current of the first diode 31 and the second diode 32 in a manner similar to the amplifying device shown in FIG. 1.

An ECM is connected to an input terminal 21 and frequency characteristics become flat to a voice band by high input impedance of a CMOS amplifier and the input impedance is set at several GΩ to several tens of GΩ and thereby, response time after detecting a loud voice or turning on a power source of the ECM is speeded up and desired electrical characteristics are achieved.

Further, a path for releasing a surge voltage to a power source terminal or an earth terminal without an influence on a signal (20 Hz to 20 kHz) of a voice band entering from the input terminal 21 can be constructed by connecting a fifth P-channel MOS transistor 27 and a seventh N-channel MOS transistor 28 to an output terminal of a voltage source 24 as an ESD protective element. A current emission path of the case where the surge voltage intrudes from the input terminal 21 is similar to that described with reference to FIGS. 1B and 1C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

In addition, since the ESD withstand current rating depends on allowable current values of the first diode 31 and the second diode 32, it is necessary to set sizes of the first diode 31 and the second diode 32 so that the input impedance is several GΩ to several tens of GΩ and the ESD withstand current rating without requiring special handling or management in manufacturing is obtained according to characteristics of an element.

Figure 6:
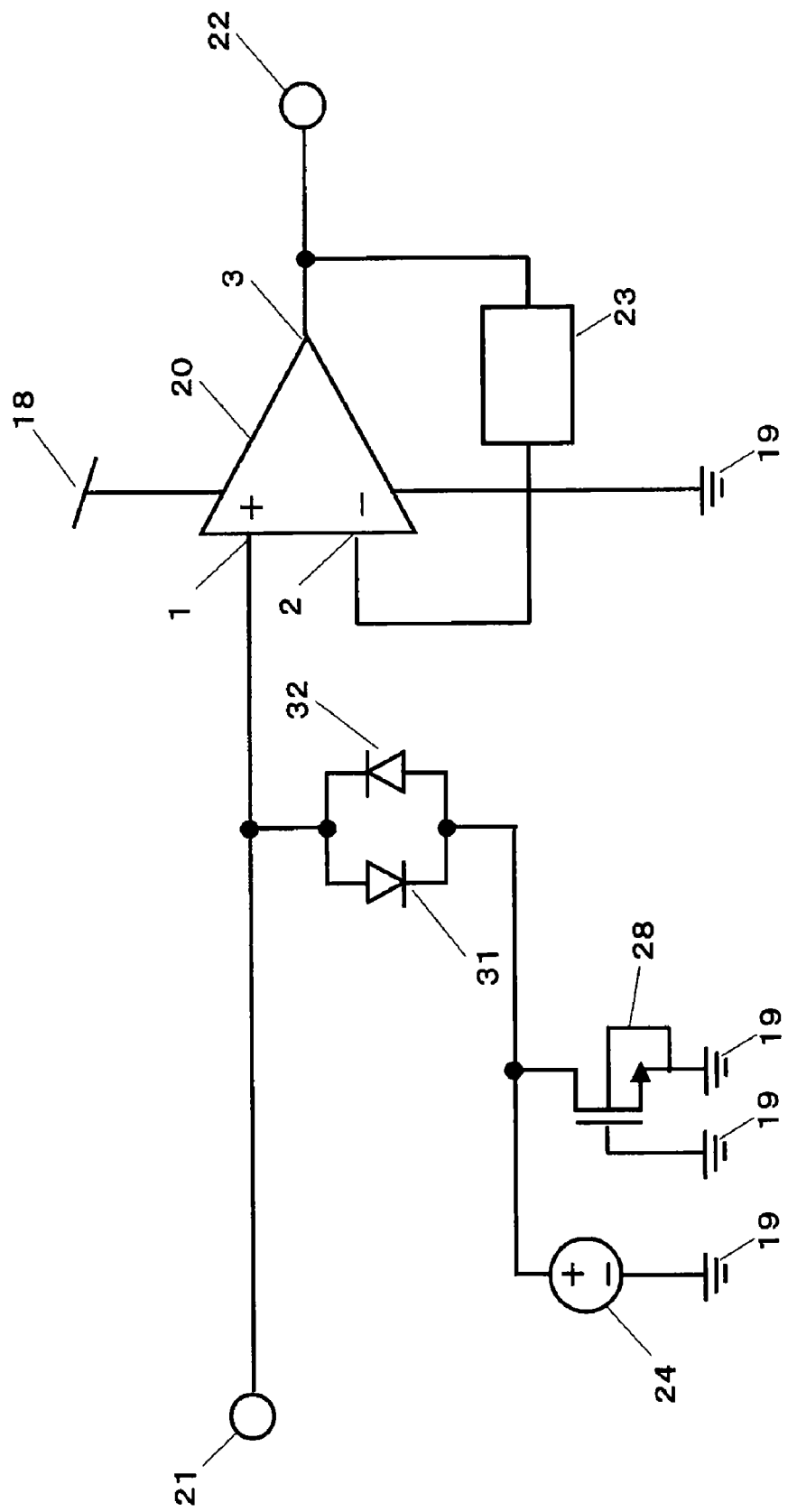
FIG. 6 is a diagram describing an amplifying device (6) according to an embodiment of the invention.

FIG. 6 is a diagram describing an amplifying device (6) according to an embodiment of the invention. The same numerals are assigned to the means having the same action and effect as those described in FIGS. 1A to 5 and FIGS. 11 to 12, and the detailed description is omitted. The amplifying device shown in FIG. 6 is an apparatus excluding the fifth P-channel MOS transistor 27 in the configuration shown in FIG. 5.

In the amplifying device of the configuration of FIG. 6, a path for releasing a surge voltage to a power source terminal or an earth terminal without an influence on a signal (20 Hz to 20 kHz) of a voice band entering from an input terminal 21 can be constructed by connecting a seventh N-channel MOS transistor 28 to an output terminal of a voltage source 24 as an ESD protective element. A current emission path of the case where the surge voltage intrudes from the input terminal 21 is similar to that described with reference to FIGS. 2B and 2C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

Figure 7A:
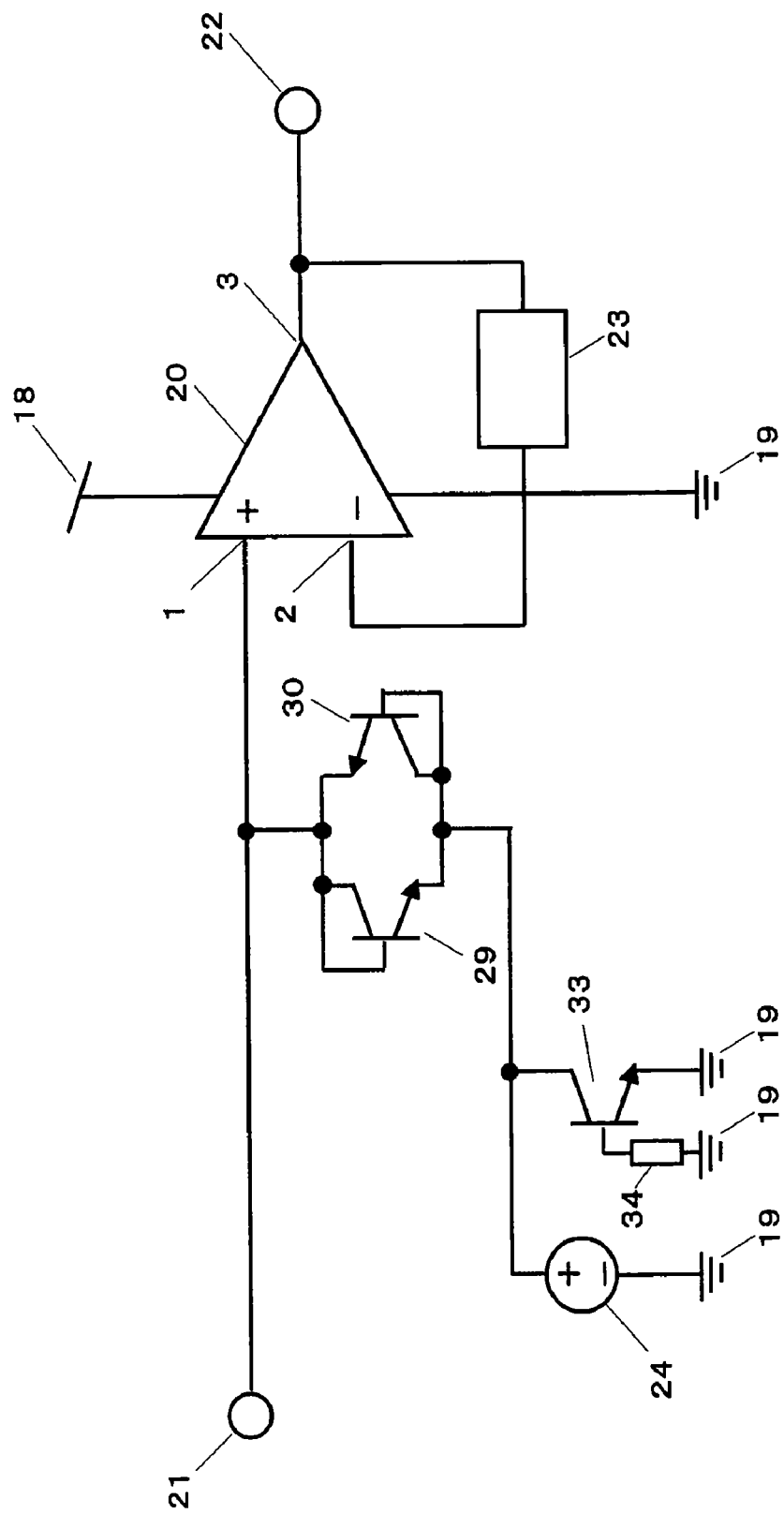
FIG. 7A is a diagram describing an amplifying device (7) according to an embodiment of the invention.

FIG. 7A is a diagram describing an amplifying device (7) according to an embodiment of the invention. The same numerals are assigned to the means having the same action and effect as those described in FIGS. 1A to 6 and FIGS. 11 to 12, and the detailed description is omitted. In a configuration of FIG. 7A, 33 is a third NPN transistor, and 34 is a fourth resistor. The amplifying device shown in FIG. 7A is an apparatus in which the seventh N-channel MOS transistor 28 is replaced with the third NPN transistor 33 and the fourth resistor 34 in the configuration shown in FIG. 4.

Figure 7B:
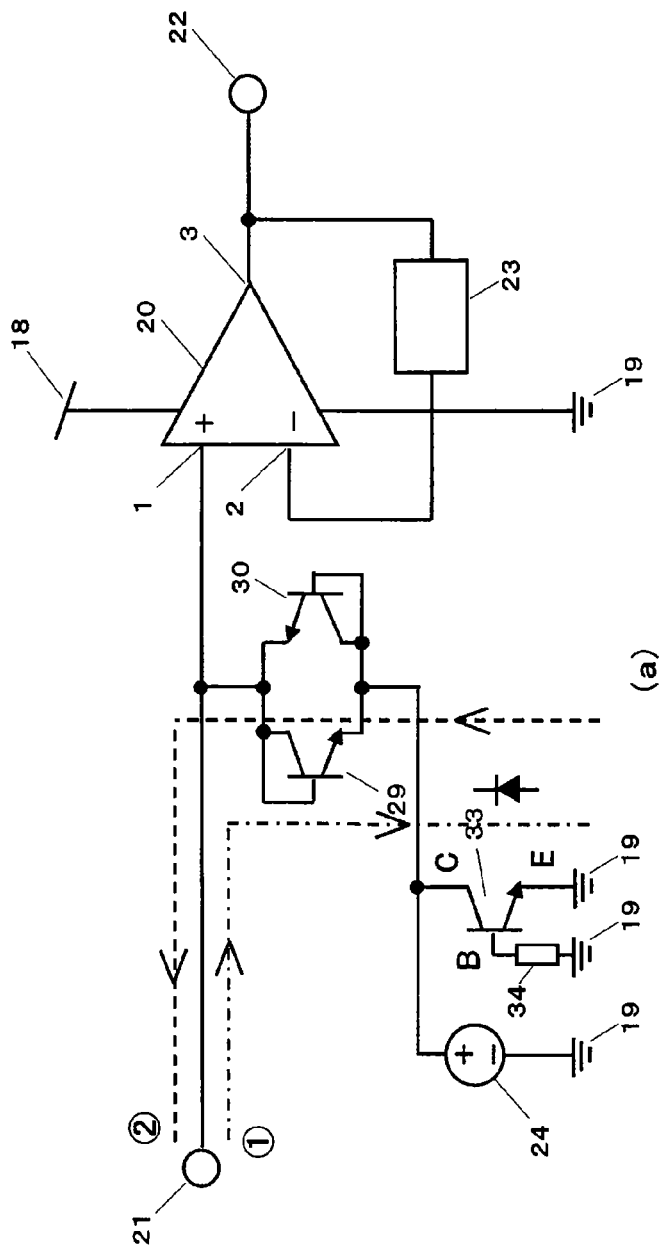
FIG. 7B is a diagram describing a surge current emission path in the amplifying device (7) according to the embodiment of the invention.

In the amplifying device of the configuration of FIG. 7A, a path for releasing a surge voltage to a power source terminal or an earth terminal without an influence on a signal (20 Hz to 20 kHz) of a voice band entering from an input terminal 21 can be constructed by connecting the third NPN transistor 33 and the fourth resistor 34 to an output terminal of a voltage source 24 as an ESD protective element. A current emission path of the case where the surge voltage intrudes from the input terminal 21 will be described in the case based on an earth terminal 19 with reference to FIG. 7B. FIG. 7B(a) shows a surge current emission path in the case based on the earth terminal 19, and FIG. 7B(b) shows a cross section of the third NPN transistor 33.

When a positive surge voltage is applied to the input terminal 21, a diode formed between a collector and a base of the third NPN transistor 33 first breaks down and a current flows in the fourth resistor between the collector and the base as shown in reference to FIG. 7B(b). When the product of this current and the fourth resistor 34 reaches 0.7 V or more, the third NPN transistor 33 is turned on. Then, a current flows between the collector and an emitter of the third NPN transistor 33 and a surge current flows in the earth terminal 19. That is, when the positive surge voltage is applied to the input terminal 21, a current flows in a path shown by a chain line in FIG. 7B. On the other hand, when a negative surge voltage is applied to the input terminal 21, a current flows from the earth terminal 19 to the input terminal 21 via a diode between a substrate ($P_{SUB}$) and the collector of the third NPN transistor 33 and a second NPN transistor 30 as shown by a broken line in FIG. 7B(a).

By the configuration described above, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

Figure 7B:
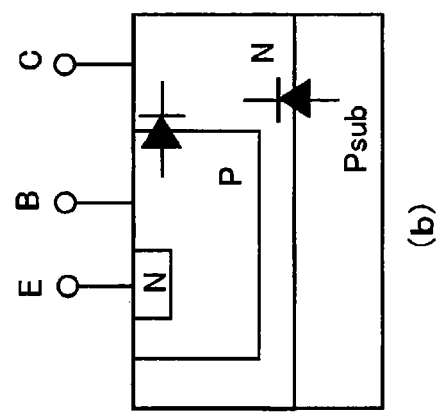

In FIG. 7, the example in which 29 and 30 are NPN transistors is shown, but the same effect is obtained even in respective PNP transistors, an N-channel MOS transistor or a P-channel MOS transistor, and this is included in the examples of the invention. Also, even when the fourth resistor 34 has an extremely small value, the same effect is obtained and this is included in the examples of the invention. In addition, the fourth resistor 34 normally has about 5 KΩ to 20 KΩ. Also, a resistance value of the fourth resistor 34 may be zero though a voltage (voltage at the time of releasing a surge voltage) broken down as an ESD protective element becomes somewhat high (about several V).

Figure 8:
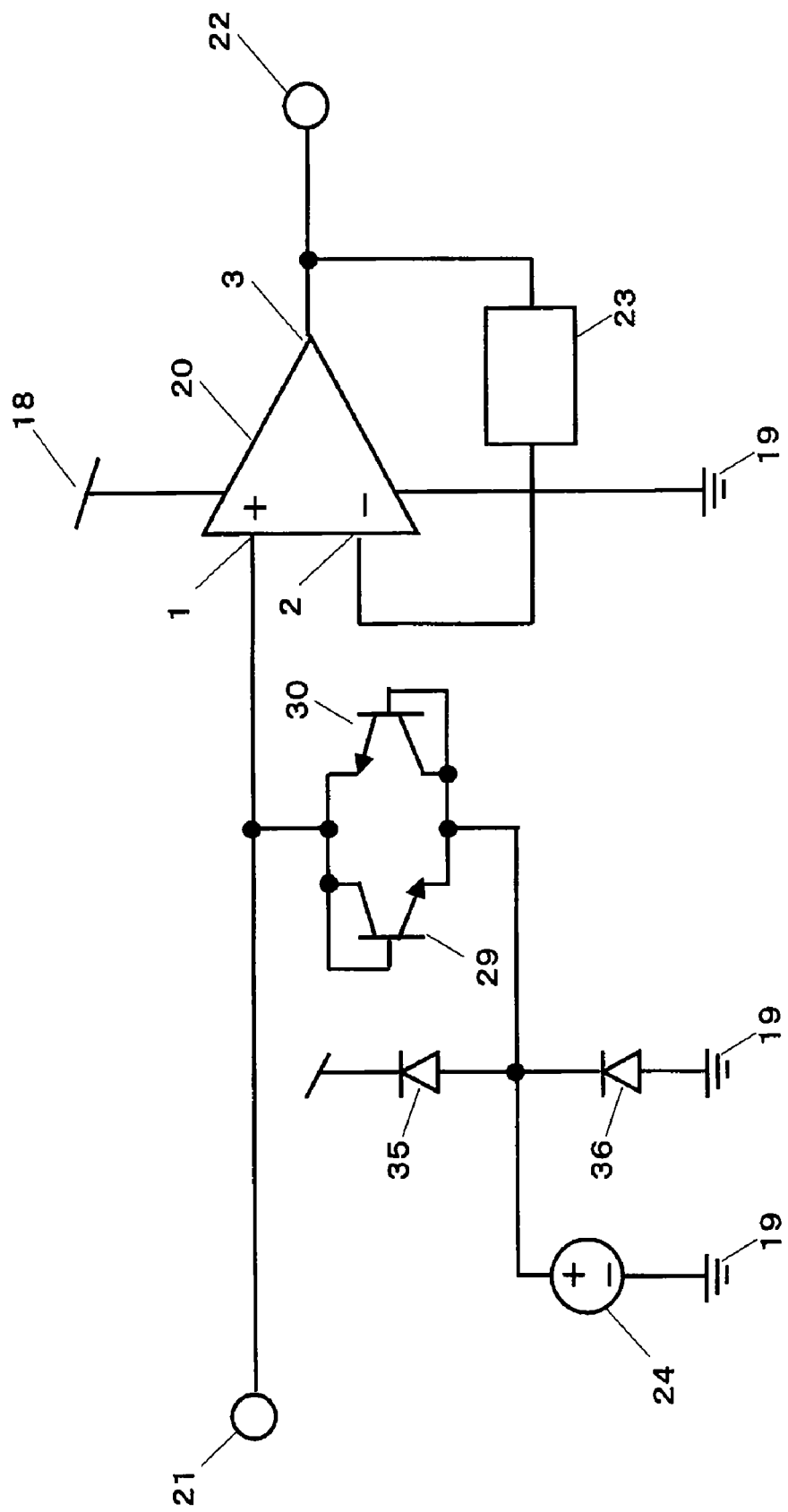
FIG. 8 is a diagram describing an amplifying device (8) according to an embodiment of the invention.

FIG. 8 is a diagram describing an amplifying device (8) according to an embodiment of the invention. The same numerals are assigned to the means having the same action and effect as those described in FIGS. 1A to 7B and FIGS. 11 to 12, and the detailed description is omitted.

In a configuration of FIG. 8, 35 is a third diode, and 36 is a fourth diode. The amplifying device shown in FIG. 8 is an apparatus in which the fifth P-channel MOS transistor 27 and the seventh N-channel MOS transistor 28 are replaced with the third diode 35 and the fourth diode 36 in the configuration shown in FIG. 3. In the amplifying device of the configuration of FIG. 8, a path for releasing a surge voltage to a power source terminal or an earth terminal without an influence on a signal (20 Hz to 20 kHz) of a voice band entering from an input terminal 21 can be constructed by connecting the third diode 35 and the fourth diode 36 to an output terminal of a voltage source 24 as an ESD protective element. A current emission path of the case where the surge voltage intrudes from the input terminal 21 is similar to that described with reference to FIGS. 1B and 1C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

Also, in FIG. 8, the example in which 29 and 30 are NPN transistors is shown, but the same effect is obtained even in respective PNP transistors, an N-channel MOS transistor or a P-channel MOS transistor, and this is included in the examples of the invention.

Figure 9:
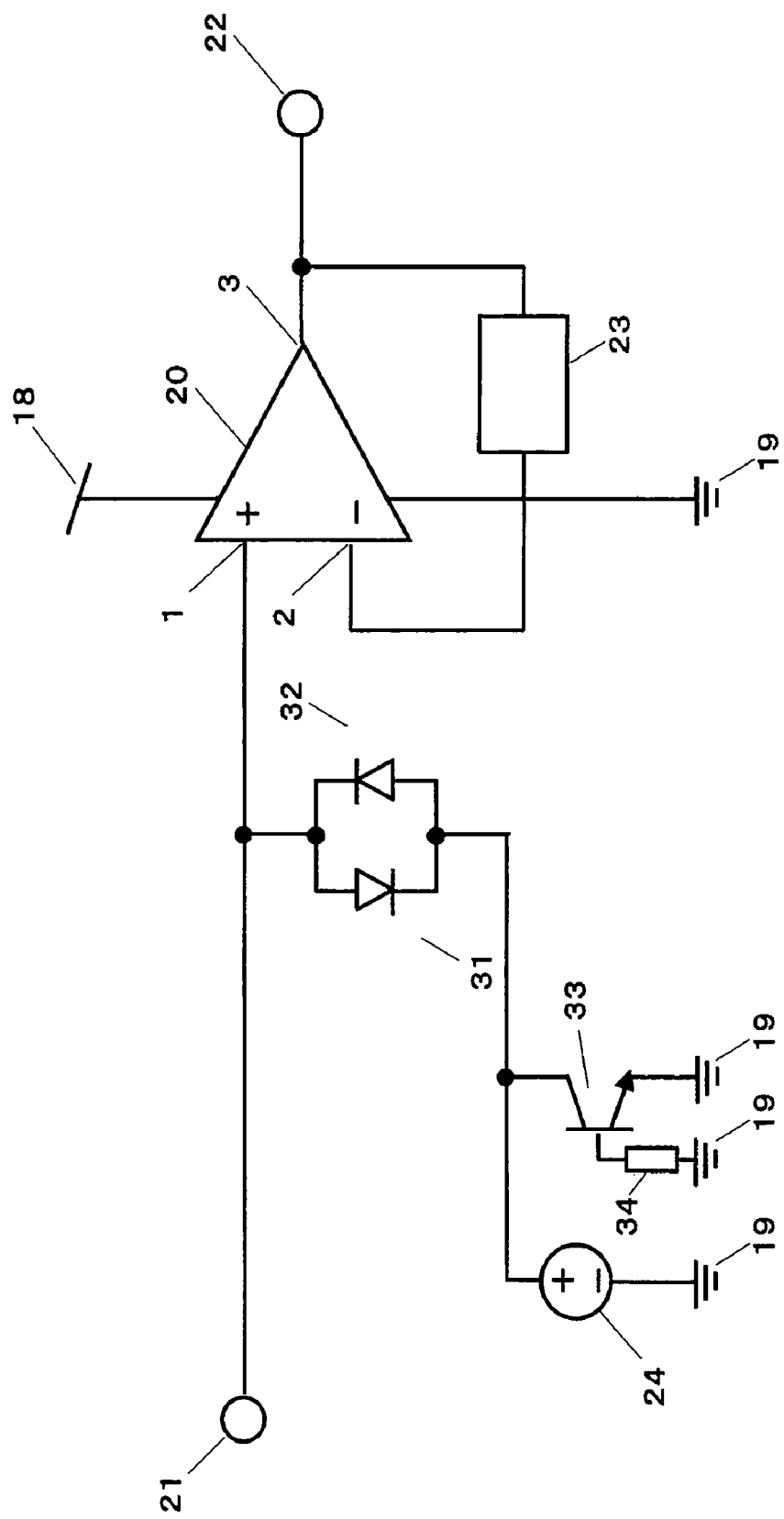
FIG. 9 is a diagram describing an amplifying device (9) according to an embodiment of the invention.

FIG. 9 is a diagram describing an amplifying device (9) according to an embodiment of the invention. The same numerals are assigned to the means having the same action and effect as those described in FIGS. 1A to 8 and FIGS. 11 to 12, and the detailed description is omitted. The amplifying device shown in FIG. 9 is an apparatus in which the first NPN transistor 29 and the second NPN transistor 30 are replaced with a first diode 31 and a second diode 32 in the configuration shown in FIGS. 7A and 7B.

In the amplifying device of the configuration of FIG. 9, a path for releasing a surge voltage to a power source terminal or an earth terminal without an influence on a signal (20 Hz to 20 kHz) of a voice band entering from an input terminal 21 can be constructed by connecting a third NPN transistor 33 and a fourth resistor 34 to an output terminal of a voltage source 24 as an ESD protective element. A current emission path of the case where the surge voltage intrudes from the input terminal 21 is similar to that described with reference to FIG. 7B. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

Even when the fourth resistor 34 has an extremely small value, the same effect is obtained and this is included in the examples of the invention. In addition, the fourth resistor 34 normally has about 5 KΩ to 20 KΩ. Also, a resistance value of the fourth resistor 34 may be zero though a voltage (voltage at the time of releasing a surge voltage) broken down as an ESD protective element becomes somewhat high (about several V).

Figure 10:
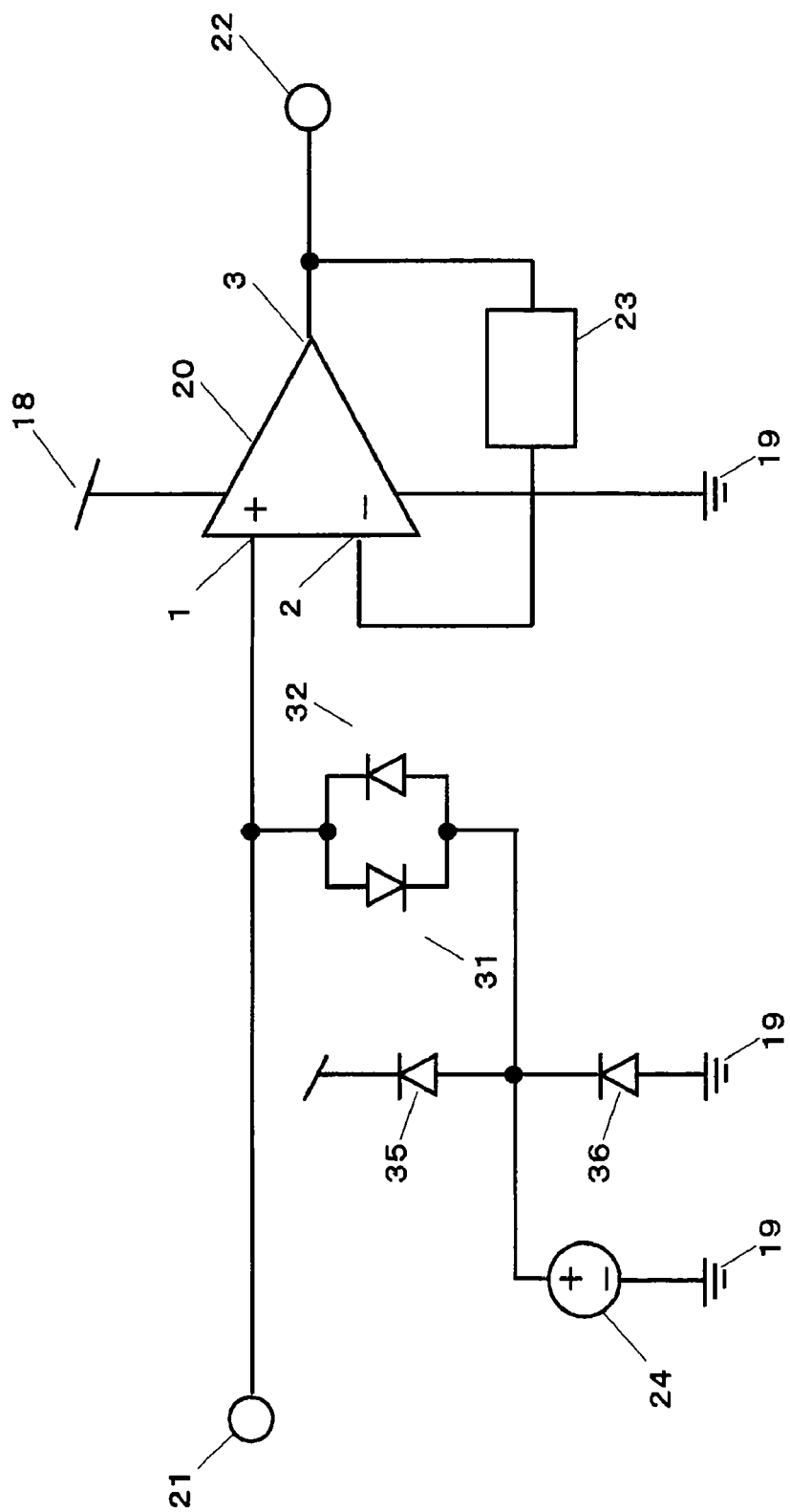
FIG. 10 is a diagram describing an amplifying device (10) according to an embodiment of the invention.

FIG. 10 is a diagram describing an amplifying device (10) according to an embodiment of the invention. The same numerals are assigned to the means having the same action and effect as those described in FIGS. 1A to 9 and FIGS. 11 to 12, and the detailed description is omitted. The amplifying device shown in FIG. 10 is an apparatus in which the first NPN transistor 29 and the second NPN transistor 30 are replaced with a first diode 31 and a second diode 32 in the configuration shown in FIG. 8.

In the amplifying device of the configuration of FIG. 10, a path for releasing a surge voltage to a power source terminal or an earth terminal without an influence on a signal (20 Hz to 20 kHz) of a voice band entering from an input terminal 21 can be constructed by connecting a third diode 35 and a fourth diode 36 to an output terminal of a voltage source 24 as an ESD protective element. A current emission path of the case where the surge voltage intrudes from the input terminal 21 is similar to that described with reference to FIGS. 1B and 1C. Also, input impedance is set at several GΩ to several tens of GΩ and desired electrical characteristics are satisfied and an ESD withstand current rating is improved and thereby, the need for special handling or management in manufacturing is eliminated, so that manufacturing lead time and cost can be reduced.

INDUSTRIAL APPLICABILITY

The invention can be used in a small portable device such as a mobile telephone as an amplifying device for setting input impedance at several GΩ to several tens of GΩ and improving an ESD withstand current rating.

The invention claimed is:

1. An amplifying apparatus, comprising:
   an amplifying circuit;
   a voltage source;
   a high-resistance circuit; and
   an ESD protective element, connected to an output terminal of the voltage source;
   wherein an input terminal of the amplifying circuit is connected to the output terminal of the voltage source through the high-resistance circuit;
   a signal inputted from the input terminal is amplified according to an output voltage of the voltage source;
   the ESD protective element includes an N-channel MOS transistor in which a drain is connected to an output terminal of the voltage source and a gate and a source are connected to a low-potential power source terminal.

2. The amplifying apparatus as claimed in claim 1, wherein the ESD protective element further includes a P-channel MOS transistor in which a drain is connected to an output terminal of the voltage source and a gate and a source are connected to a high-potential power source terminal.

3. The amplifying apparatus as claimed in claim 1, wherein the high-resistance circuit is made of a MOS transistor.

4. The amplifying apparatus as claimed in claim 1, wherein the high-resistance circuit is made of a bipolar transistor.

5. The amplifying apparatus as claimed in claim 1, wherein the high-resistance circuit is made of a diode.

6. The amplifying apparatus, comprising:
   an amplifying circuit;
   a voltage source;
   a high-resistance circuit; and
   an ESD protective element connected to an output terminal of the voltage source;
   wherein an input terminal of the amplifying circuit is connected to the output terminal of the voltage source through the high-resistance circuit;
   a signal inputted from the input terminal is amplified according to an output voltage of the voltage source;
   the ESD protective element includes an NPN transistor in which a collector is connected to an output terminal of the voltage source and an emitter and a base are connected to a low-potential power source terminal.

7. The amplifying apparatus as claimed in claim 6, wherein a base of the NPN transistor is connected to the low-potential power source terminal through a resistor.

8. The amplifying apparatus as claimed in claim 6, wherein the high-resistance circuit is made of a bipolar transistor.

9. The amplifying apparatus as claimed in claim 6, wherein the high-resistance circuit is made of a diode.

10. The amplifying apparatus as claimed in claim 1, wherein a capacitive signal source is connected to an input terminal of the amplifying circuit.

11. The amplifying apparatus as claimed in claim 10, wherein the capacitive signal source is an electret condenser microphone.

12. The amplifying apparatus as claimed in claim 1, wherein the amplifying circuit is a CMOS amplifier with high input impedance.

13. The amplifying apparatus as claimed in claim 6, wherein a capacitive signal source is connected to an input terminal of the amplifying circuit.

14. The amplifying apparatus as claimed in claim 13, wherein the capacitive signal source is an electret condenser microphone.

15. The amplifying apparatus as claimed in claim 6, wherein the amplifying circuit is a CMOS amplifier with high input impedance.

* * * * *